Nov. 8, 1960 R. W. GILBERT 2,959,689

DIRECT CURRENT GATE CIRCUIT

Filed May 8, 1957

ROSWELL W. GILBERT
INVENTOR.

BY
Rudolph J. Jirick
ATTORNEY

United States Patent Office 2,959,689
Patented Nov. 8, 1960

2,959,689

DIRECT CURRENT GATE CIRCUIT

Roswell W. Gilbert, Montclair, N.J., assignor, by mesne assignments, to Daystrom, Incorporated, Murray Hill, N.J., a corporation of New Jersey Filed May 8, 1957, Ser. No. 657,911

15 Claims. (Cl. 307—88.5)

Figure 1:
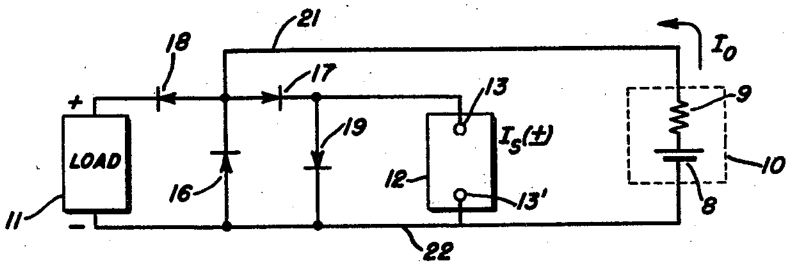

This invention relates to a diode gate circuit and particularly to a diode gate circuit for rapidly switching a D.-C. current into and away from a load. This application is a continuation-in-part of my copending application Serial Number 645,604, filed March 12, 1957 and entitled Pulse-Time Encoding Apparatus.

D.-C. gating circuits are used extensively in electrical and electronic equipment. If the speed, or rate at which the D.-C. current is to be switched is relatively low, and is not a critical factor in the function of the equipment, many of the ordinary mechanical relays are adequate to perform the switching function. In other types of electronic equipment, however, it is not only desirable, but also necessary to switch a D.-C. current both rapidly and precisely. The need for such a switching operation arises in certain quantitative measuring circuits. One example of such a use is in the input circuit to an electronic computer wherein it is desired to periodically sample a plurality of D.-C. analog input signals for use in the computer. The gating, or switching must be done not only with precision, but also with great speed.

An object of this invention is the provision of a D.-C. diode gate circuit which functions rapidly and with precision.

An object of this invention i sthe provision of a D.-C. diode gate circuit for switching a D.-C. current into and away from a low impedance load.

An object of this invention is the provision of a D.-C. diode gate circuit which functions to switch a D.-C. current into and away from a load in response to a switching current which may be variable in magnitude within wide limits.

An object of this invention is the provision of a D.-C. diode gate circuit having a leakage ratio and switching current independence ratio approaching that of a mechanical relay.

An object of this invention is the provision of a D.-C. gating circuit for selectively switching a D.-C. current into and away from a load, the said circuit comprising a source of D.-C. current to be switched, a source of D.-C. switching current, a plurality of diodes, means connecting the said D.-C. current to be switched to the said load through at least one of the said diodes, the remainder of the said diodes being connected to form a rectifier network, and means connecting the said switching current to the said source of D.-C. current to be switched through the said rectifier network.

An object of this invention is the provision of a D.-C. gating circuit for selectively switching a D.-C. current into and away from a load, the said circuit comprising a source of D.-C. switching current, first and second series connected diodes arranged in the same sense and connected in series with the said source of D.-C. switching current, the said first diode being connected in shunt circuit with the said D.-C. current to be switched and in a non-conductive sense therewith, a third diode in series circuit connection with the said load, the said series connected third diode and load being in shunt with the said first diode, the said third diode being arranged in the same sense with the said first diode in the circuit including the said first diode and the said series connected third diode and load, and a fourth diode connected in shunt with the said source of D.-C. switching current, the said fourth diode being connected in the same sense as the said first and second diodes in the circuit including the said first, second and fourth diodes.

These and other objects and advantages will become apparent from the following description when taken with the accompanying drawings. It will be understood that the drawings are for purposes of illustration and are not to be construed as defining the scope or limits of the invention, reference being had for the latter purposes to the appended claims.

Figure 2:
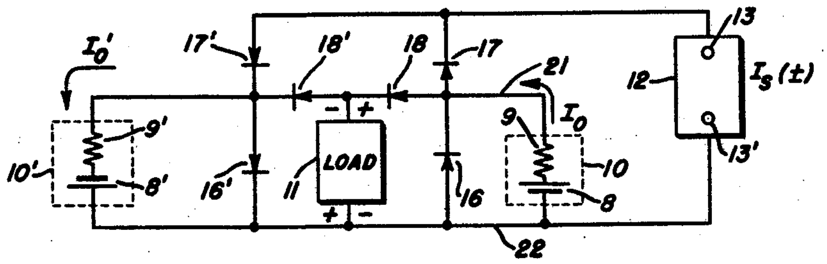

In the drawings wherein like reference characters denote like parts in the several views:

Figure 1 is a schematic circuit diagram of my D.-C. gate circuit for switching a D.-C. current into and away from a load; and, Figure 2 is a schematic circuit diagram of a modified version of the D.-C. gate circuit shown in Figure 1 for alternately switching two D.-C. currents into a common load.

Reference is now made to Figure 1 of the drawings wherein there is shown a series connected battery 8 and resistor 9 which comprises a D.-C. current source designated generally by the reference numeral 10. The gating circuit of Figure 1 is adapted to switch a D.-C. current designated $I_0$, which is supplied by the current source 10 (or any other suitable source of D.-C. current) into and away from a D.-C. load designated 11. Opening and closing of the diode gate is controlled by a switching current designated $I_s$ which is derived from a switching current source 12 having terminals 13, 13' which are connected into the gating circuit. The switching current $I_s$ is adapted to assume both a negative or positive polarity, as indicated by the (±) sign, and may be derived from any suitable current source, such as an Eccles-Jordan, or flip-flop, circuit having an output waveform of alternate negative and positive polarities.

The gating circuit is simple and comprises four diodes 16, 17, 18 and 19 arranged to switch the D.-C. current $I_0$ into, and away from, the load 11, under the control of the switching current $I_s$. The load 11 is in series circuit connection with the diode 18. One end of the series connected load 11 and diode 18 is connected through a lead wire 21 to one side of the current source 10, while the other side of the series-connected load 11 and diode 18 is connected to the other side of the current source 10 through a common lead wire designated 22. It will be noted in the circuit which includes the current source 10, load 11 and diode 18, that the diode is connected in a forward, or conductive, sense with the current source 10. The diode 16 is connected in shunt circuit with the source of D.-C. current to be switched 10, in a reverse, or non-conductive, sense therewith. In addition, the two diodes 16 and 17 comprise a series circuit with the source of switching current 12. The two series-connected diodes 16 and 17 are arranged in the same sense in the circuit which includes the two diodes and the source of D.-C. switching current. The diode 19 is connected in shunt with the source of D.-C. switching current 12 to the terminals 13, 13' thereof. The diodes 16, 17 and 19, when considered apart from the remainder of the gate circuit, comprise a $\pi$ network; the diodes being arranged in the same sense in the network which includes the three diodes.

In operation, the D.-C. current $I_0$ is gated open into the load 11 when the switching current is positive (that is, when the terminal 13 is positive with respect to the terminal 13', which, in turn, is connected to the common lead wire 22). When the switching current is positive, the diodes 16 and 17 are blocked, that is, non-conducting, and the diodes 18 and 19 are conducting. All of the D.-C. current $I_0$ will, therefore, pass through the diode 18 and the load 11, while all of the switching current is shunted through the diode 19. The D.-C. gate is closed, and the D.-C. current $I_0$ gated away from the load 11, when the switching current is reversed in polarity, or negative. With a negative switching current the diodes 16 and 17 conduct and the diodes 18 and 19 are blocked. None of the D.-C. current $I_0$, or switching current $I_s$, passes through the diode 18 or the load 11; but instead, the D.-C. current $I_0$ is shunted through the diode 16 and the switching current $I_s$ is conducted through the connected diodes 16 and 17.

For operation of the gating circuit, the switching current $I_s$ must be at least as large as the switched current $I_0$ in gate-closed direction. With a positive D.-C. current $I_0$, as shown, the gate is opened by a switching current that is positive and theoretically anything greater than zero, and is closed by a negative switching current that is theoretically at least greater, in magnitude, than the positive D.-C. current $I_0$. However, in order to maintain the integrity of the D.-C. current when the gate is open, and not leak when closed, the D.-C. diode gate is preferably operated with a switching current which is 2 to 10 times as large as the D.-C. current $I_0$ in both the gate-open and gate-closed directions. For example, if a positive D.-C. current $I_0$ of five milliamperes is to be switched into and away from the load 11, the magnitude of positive and negative switching current $I_s$ preferably ranges from 10 to 50 milliamperes.

The diodes which are used in the D.-C. gating circuit are preferably of the high-performance types. Germanium, and particularly diffused junction silicon diodes possess desirable operating characteristics for use in my novel gate circuit. The circuit illustrated in Figure 1 (and also that illustrated in Figure 2, and described below) is capable of switching D.-C. current (or currents) into a low impedance load with a leakage ratio and a switching current independence ratio of better than 1 part in 10,000, thus approaching the performance of mechanical relays. The load is limited in potential burden to a level where the diode 17 will block due to the forward drop through the diode 19 less the load burden potential. The gating circuit is therefore suited only to low impedance loads.

It will be understood that in the drawings, all of the polarities and diode directions are relative. For example, in Figure 1, all of the diodes 16, 17, 18 and 19 could be reversed and the polarity of the D.-C. current source 10 changed from positive to negative. In the resulting circuit, the negative D.-C. current $I_0$ would be gated open through the load 11 when the switching current $I_s$ was negative and gated away from the load when the switching current was positive. Use of this is made in the modified gate circuit shown in Figure 2 of the drawings.

Reference is now made to Figure 2 wherein there is shown the modified, or "double version," of the D.-C. gate shown in Figure 1. The D.-C. gate shown in Figure 2 includes a second source of D.-C. current 10' (comprising a series connected battery 8' and resistor 9') in addition to the source of D.-C. current 10. The single switching current $I_s$, from the switching current source 12, is adapted to alternately switch the two D.-C. currents $I_0$ and $I_{0'}$ into the common load 11 in the gate circuit of Figure 2. The diodes 16, 17 and 18, the current source 10 and the source of switching current 12 are counterparts to the like referenced parts in Figure 1. In order to accommodate the second D.-C. current $I_{0'}$, diodes 16', 17' and 18' are included in the circuit. The polarity of the D.-C. current source 10' is reversed from that of the current source 10 as are the directions of the diodes 16', 17' and 18' from the diodes 16, 17 and 18. It will be noted that the diode 19 is eliminated from the circuit of Figure 2; the function of the diode 19 being performed by the diodes 16' and 17' in the complementary portion of the circuit.

In the operation of the D.-C. gating circuit of Figure 2, the D.-C. current $I_0$ is gated into the load 11 when the switching current is positive (that is, when the terminal 13 is positive with respect to the common lead wire 22). When the switching current is positive, the diodes 16, 17 and 18' are blocked, and the diodes 18, 16' and 17' are conducting. All of the positive D.-C. current $I_0$ will therefore pass through the load 11, and the D.-C. current $I_{0'}$ is gated away from the load under these conditions. When the switching current polarity is reversed and becomes negative, the D.-C. current $I_{0'}$ is gated into the load 11. With a negative switching current, the diodes 16, 17 and 18' are conducting and the diodes 18, 16' and 17' are blocked. All of the negative D.-C. current $I_{0'}$ will therefore pass through the load 11 while the D.-C. current $I_0$ is gated away from the load. As in the case of the gating circuit of Figure 1, the switching current $I_s$ of the gating circuit of Figure 2 is preferably 2 to 10 times larger than the currents to be switched, $I_0$ and $I_{0'}$ in both gate-open and gate-closed directions for each of the D.-C. currents to be switched. Also, all of the polarities and diode directions of the Figure 2 circuit are relative.

In both of the gating circuits shown in Figures 1 and 2, the gating, or switching function is performed accurately and rapidly in response to a switching current which may vary within wide limits. It is not necessary to closely regulate the switching current in order to obtain proper operation of the gating circuits. This, then, is another important advantage of my novel D.-C. gating circuits.

Having now described my invention in detail, in accordance with the patent statutes, various other changes and modifications will suggest themselves to those skilled in this art. It is intended that such changes and modifications shall fall within the spirit and scope of the invention as recited in the following claims.

I claim:

1. A conductively coupled direct current gating circuit for selectively switching a direct current into and away from a load, the said circuit comprising a source of direct switching current, first and second series-connected diodes arranged in the same sense and connected in series with the said source of direct switching current, the said first diode being connected in shunt relation with the source of direct current to be switched and in a non-conductive sense therewith, a third diode in series circuit connection with the said load, the said series connected third diode and load being in shunt with the said first diode, the said third diode being arranged in the same sense with the said first diode in the circuit including the said first diode and the said series-connected third diode and load, and a fourth diode connected in shunt with the said source of direct switching current, the said fourth diode being connected in the same sense as the said first and second diodes in the circuit including the said first, second and fourth diodes.

2. The invention as recited in claim 1 wherein the said load is of the low impedance direct current type.

3. The invention as recited in claim 1 wherein the said diodes are of the diffused junction silicon type.

4. A conductively coupled direct current gating circuit for selectively switching a direct current into and away from a load, the said circuit comprising a source of negative and positive direct switching current of equal or greater magnitude than the said direct current to be switched in both gate-open and gate-closed directions, first and second diodes in series circuit connection and arranged in the same sense, the said series connected first and second diodes being connected in series with the said source of negative and positive direct switching current, the said first diode being connected in shunt circuit with the source of direct current to be switched and in a reverse sense therewith, a third diode in series circuit connection with the said load, the said series-connected third diode and load being in shunt connection with the said first diode, the said third diode being arranged in the same sense with the said first diode in the circuit including the said first diode and the said series-connected third diode and load, and a fourth diode connected in shunt with the said source of positive and negative direct switching current, the said fourth diode being connected in the same sense with the said first and second diode in the circuit including the said first, second and fourth diodes.

5. The invention as recited in claim 4 wherein the said load is of the low impedance direct current type.

6. The invention as recited in claim 4 wherein the said diodes are of the diffused junction silicon type.

7. A conductively coupled direct current gating circuit for selectively switching first and second direct currents into and away from a load, the said circuit comprising a source of direct switching current, first and second series connected diodes arranged in the same sense and connected in series with the said source of direct switching current, the said first diode being connected in shunt circuit with the said source of the direct current to be switched and in a reverse sense therewith, third and fourth series-connected diodes arranged in the same sense and connected in shunt with the said first and second diodes, the said third and fourth diodes being arranged in the same sense with the said first and second diodes in the circuit including the said first, second, third and fourth diodes, the said fourth diodes being connected in shunt circuit with the source of the second direct current to be switched and in opposed sense therewith, fifth and sixth series connected diodes arranged in the same sense and connected between the junction between the said first and second diodes and the junction between the said third and fourth diodes, the said fifth and sixth diodes being connected in the same sense with the said first and fourth diodes in the circuit including the said first, fourth, fifth and sixth diodes, the said load being connected between the junction between the said first and fourth diodes and the junction between the said fifth and sixth diodes.

8. The invention as recited in claim 7 wherein the said load is of the low impedance direct current type.

9. The invention as recited in claim 7 wherein the said diodes are of the diffused junction silicon type.

10. A conductively coupled direct current gating circuit for selectively switching positive and negative direct currents into and away from a load, the said circuit comprising a source of negative and positive direct switching current of equal or greater magnitude than the said negative and positive direct currents to be switched, first and second diodes in series circuit connection and arranged in the same sense, the said series connected first and second diodes being connected in series with the said source of negative and positive direct switching current, the said first diode being connected in shunt circuit with the source of the positive direct current to be switched and in opposed sense therewith, third and fourth diodes in series circuit connection and arranged in the same sense, the said series-connected third and fourth diodes being connected in shunt with the said first and second diodes and arranged in the same sense with the said first and second diodes in the circuit including the said first, second, third and fourth diodes, the said fourth diode being connected in shunt circuit with the source of the negative direct current to be switched and in opposed sense therewith, and fifth and sixth series-connected diodes arranged in the same sense and connected between the junction between the said first and second diodes and the junction between the said third and fourth diodes, the said fifth and sixth diodes being connected in the same sense with the said first and fourth diodes in the circuit including the said first, fourth, fifth and sixth diodes, the said load being connected between the junction between the said first and fourth diodes and the junction between the said fifth and sixth diodes.

11. The invention as recited in claim 10 wherein the said load is of the low impedance direct current type.

12. The invention as recited in claim 10 wherein the said diodes are of the diffused junction silicon type.

13. A four-terminal conductively coupled direct current gating circuit for selectively switching a direct current from a source of direct current to be switched into and away from a direct current type load; the said circuit comprising a source of direct switching current; the said source of direct switching current, load, and source of direct current to be switched including first, second, and third terminals, respectively, of the four-terminal circuit; a fourth circuit terminal which is common to the said source of direct switching current, load, and source of direct current to be switched; first and second series-connected diodes arranged in the same sense and connected between the said first and fourth terminals, the first diode being connected between the said third and fourth terminals and in a non-conductive sense with the direct current to be switched; a third diode connected between the said second and third terminals, the said third diode being arranged in the same sense with the said first diode in the circuit including the first diode, third diode and load; and a fourth diode connected between the first an fourth terminals and in the same sense as the said first and second diodes in the circuit including the said first, second and fourth diodes.

14. The invention as recited in claim 13, wherein the load is of the low impedance type.

15. The invention as recited in claim 13 wherein the diodes are of the diffused junction silicon type.

References Cited in the file of this patent

UNITED STATES PATENTS

| | | |
|---|---|---|
| 2,304,135 | Wise | Dec. 8, 1942 |
| 2,535,303 | Lewis | Dec. 26, 1950 |
| 2,594,449 | Kircher | Apr. 29, 1952 |
| 2,618,753 | Van Mierlo | Nov. 18, 1952 |
| 2,657,318 | Rack | Oct. 27, 1953 |
| 2,723,355 | Graham | Nov. 8, 1955 |
| 2,782,307 | Von Sivers et al. | Feb. 19, 1957 |

FOREIGN PATENTS

| | | |
|---|---|---|
| 521,313 | Great Britain | May 17, 1940 |